(12) United States Patent
Lee et al.

(10) Patent No.: US 9,613,942 B2
(45) Date of Patent: Apr. 4, 2017

(54) INTERPOSER FOR A PACKAGE-ON-PACKAGE STRUCTURE

(71) Applicant: QUALCOMM Incorporated, San Diego, CA (US)

(72) Inventors: Jae Sik Lee, San Diego, CA (US); Kyu-Pyung Hwang, Newton, MA (US); Hong Bok We, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/733,201

(22) Filed: Jun. 8, 2015

(65) Prior Publication Data

US 2016/0358899 A1     Dec. 8, 2016

(51) Int. Cl.

| H01L 25/18 | (2006.01) |
|---|---|
| H01L 23/498 | (2006.01) |
| H01L 25/065 | (2006.01) |
| H01L 23/50 | (2006.01) |
| H01L 25/00 | (2006.01) |
| H01L 21/56 | (2006.01) |
| H01L 23/31 | (2006.01) |
| H01L 21/48 | (2006.01) |
| H01L 23/14 | (2006.01) |
| H01L 23/00 | (2006.01) |
| H01L 25/10 | (2006.01) |

(52) U.S. Cl.
CPC ............ *H01L 25/18* (2013.01); *H01L 21/486* (2013.01); *H01L 21/565* (2013.01); *H01L 23/147* (2013.01); *H01L 23/3107* (2013.01); *H01L 23/49827* (2013.01); *H01L 23/49838* (2013.01); *H01L 23/49866* (2013.01); *H01L 23/50* (2013.01); *H01L 24/00* (2013.01); *H01L 25/0652* (2013.01); *H01L 25/105* (2013.01); *H01L 25/50* (2013.01); *H01L 2225/06548* (2013.01)

(58) Field of Classification Search
CPC .................. H01L 25/18; H01L 25/0652; H01L 23/49827; H01L 21/565; H01L 23/50; H01L 23/49866; H01L 23/3107; H01L 21/486; H01L 25/50; H01L 23/49838; H01L 2225/06548
USPC ........................................................ 257/741
See application file for complete search history.

(56) References Cited

U.S. PATENT DOCUMENTS

| 7,151,010 B2 | 12/2006 | Nguyen et al. |
|---|---|---|
| 7,901,987 B2 | 3/2011 | Yang et al. |
| 8,106,520 B2 | 1/2012 | Keeth et al. |
| 8,704,384 B2 | 4/2014 | Wu et al. |
| 8,736,065 B2 | 5/2014 | Gonzalez et al. |
| 8,816,404 B2 | 8/2014 | Kim et al. |
| 8,901,748 B2 | 12/2014 | Manusharow et al. |

(Continued)

OTHER PUBLICATIONS

International Search Report and Written Opinion—PCT/US2016/033948—ISA/EPO—Sep. 6, 2016.

*Primary Examiner* — Fernando L Toledo
*Assistant Examiner* — Adam S Bowen
(74) *Attorney, Agent, or Firm* — Toler Law Group, PC

(57) ABSTRACT

A package-on-package (PoP) structure includes a first die, a second die, and a memory device electrically coupled to the first die and the second die by an interposer between the first die and the second die. The interposer includes copper-filled vias formed within a mold.

28 Claims, 8 Drawing Sheets

(56) References Cited

U.S. PATENT DOCUMENTS

| | | | |
|---|---|---|---|
| 2006/0175695 A1* | 8/2006 | Lee | H01L 23/13 257/686 |
| 2012/0119373 A1 | 5/2012 | Hunt | |
| 2014/0089609 A1 | 3/2014 | Kegel et al. | |
| 2014/0159247 A1 | 6/2014 | Lyne et al. | |
| 2014/0264836 A1 | 9/2014 | Chun et al. | |
| 2014/0264840 A1 | 9/2014 | Lin et al. | |
| 2015/0200182 A1* | 7/2015 | Wang | G06F 17/5077 257/774 |
| 2015/0235989 A1* | 8/2015 | Yu | H01L 25/0652 257/712 |
| 2015/0303172 A1* | 10/2015 | Law | H01L 23/3128 257/659 |
| 2015/0303174 A1* | 10/2015 | Yu | H01L 25/0657 257/712 |

\* cited by examiner

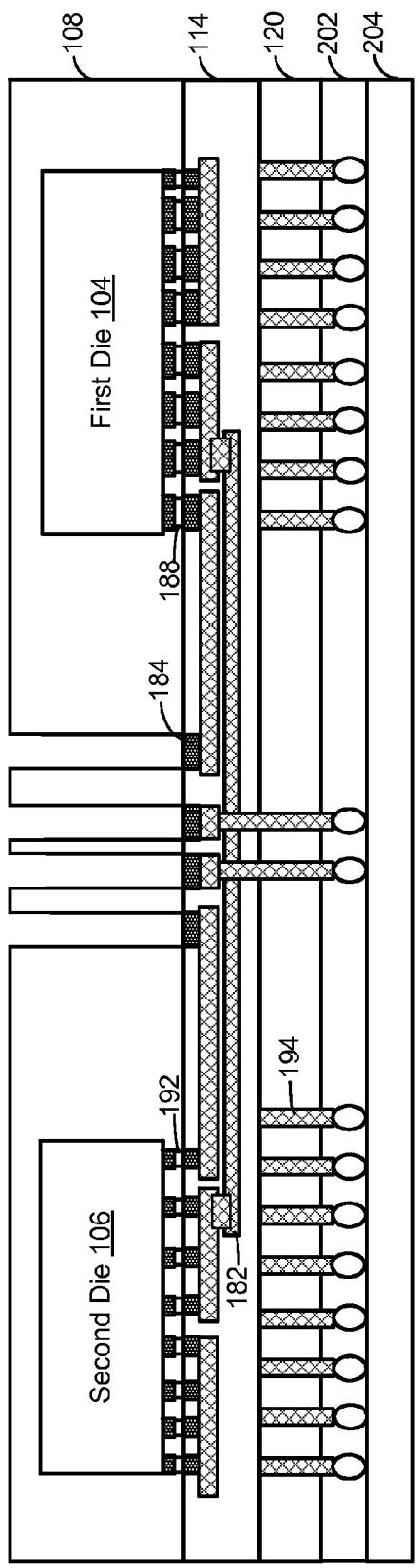
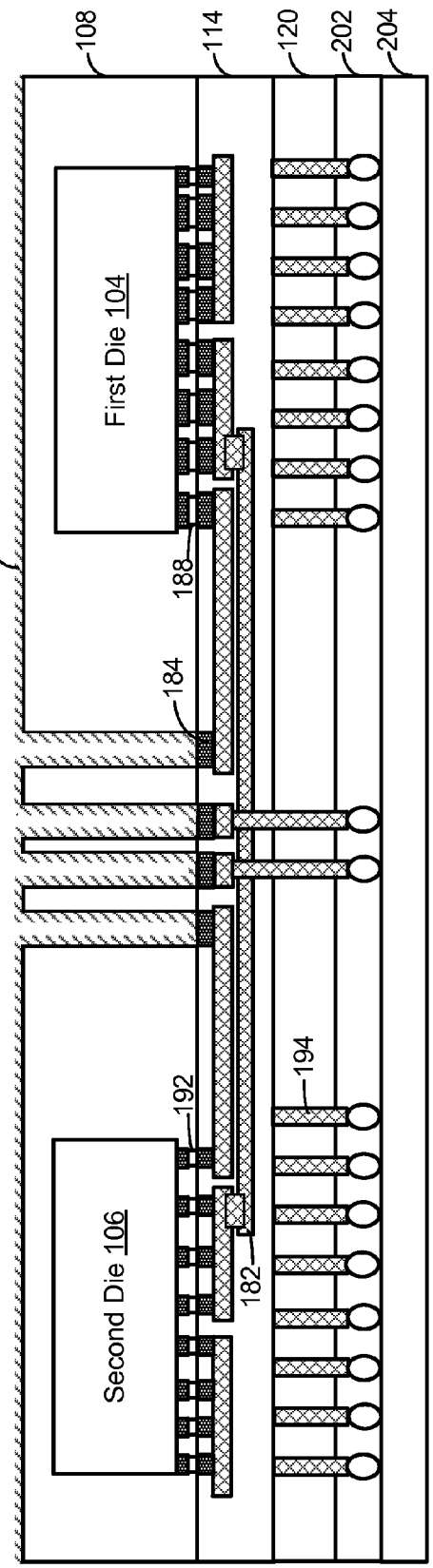
FIG. 2C
FIG. 2D

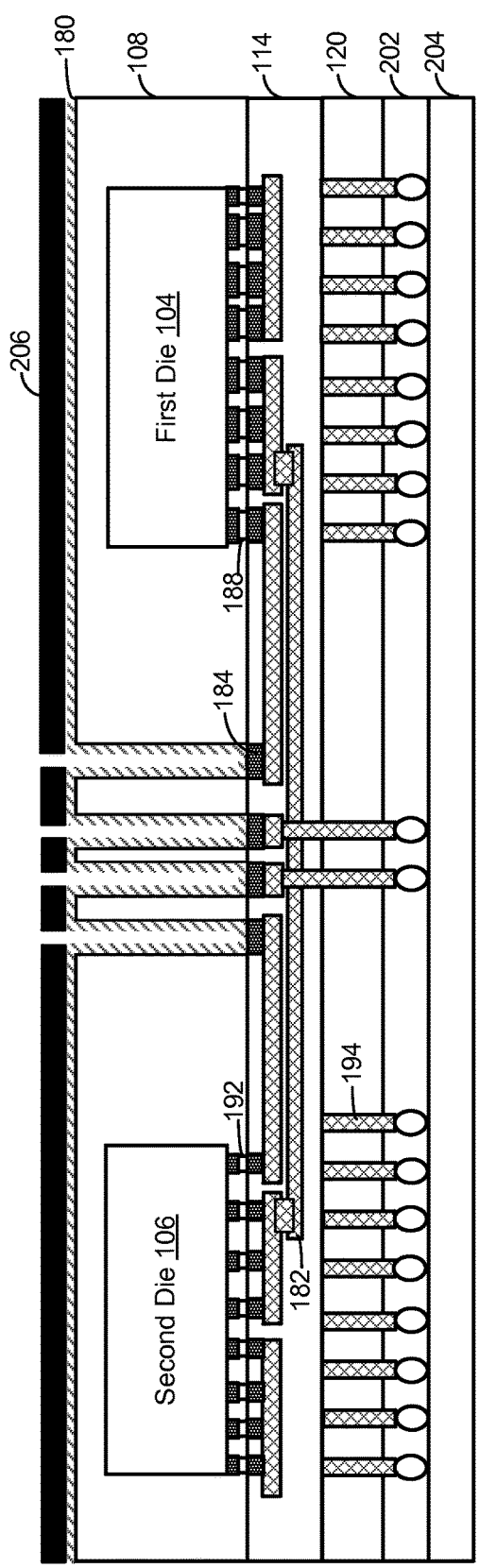
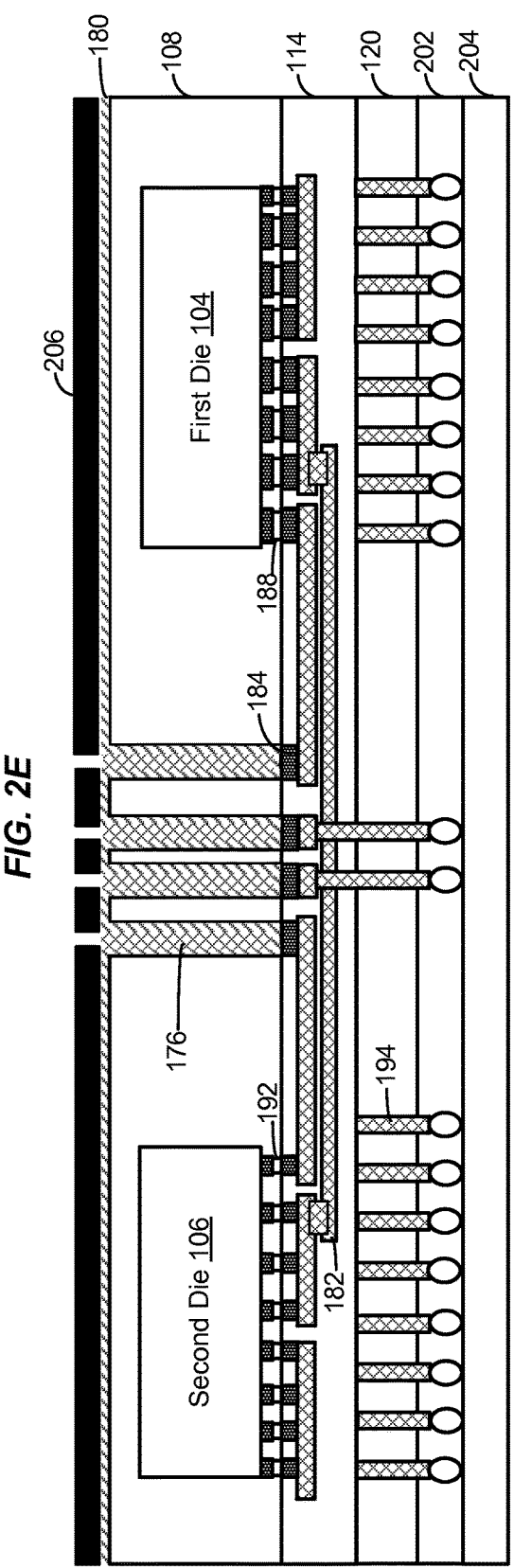
FIG. 2E
FIG. 2F

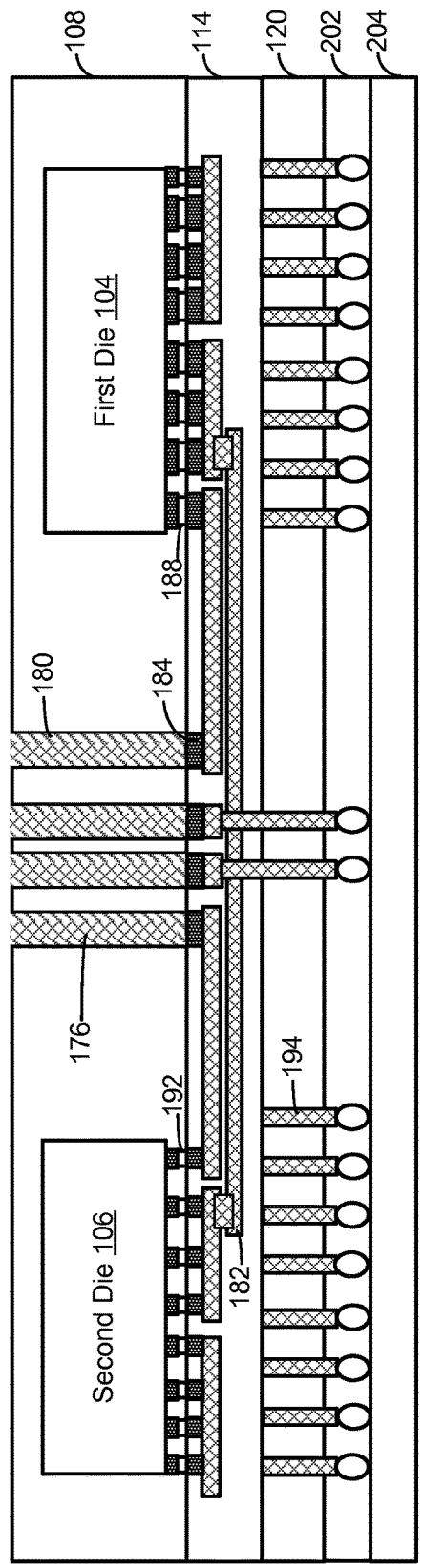
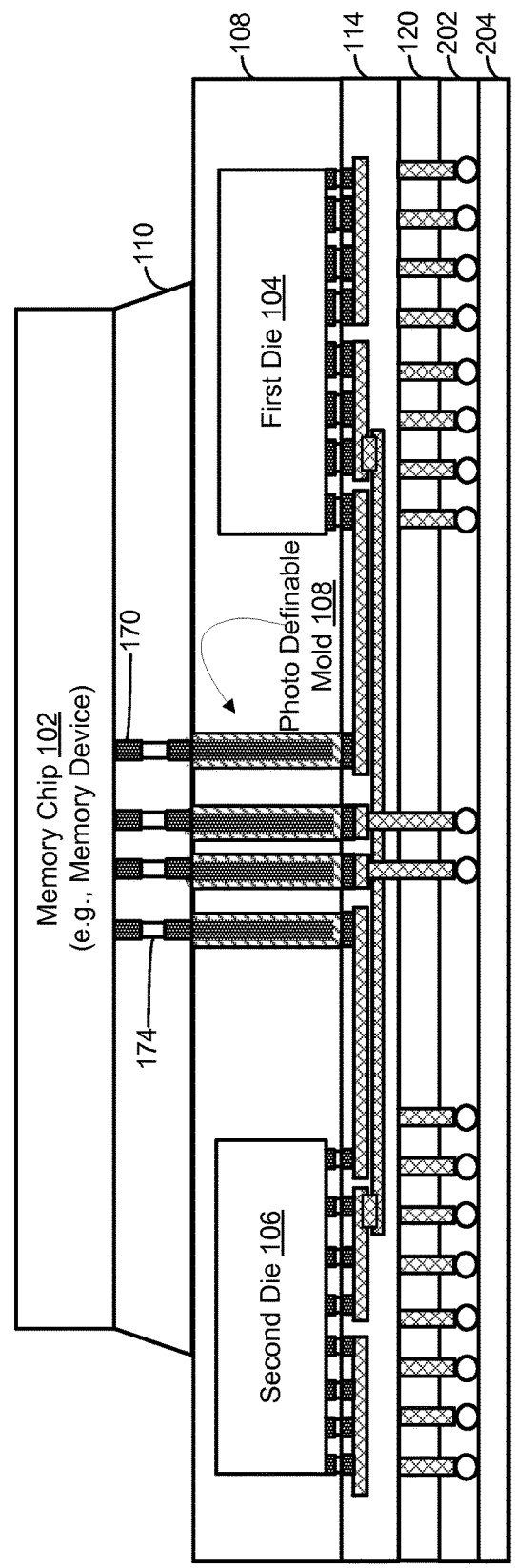
FIG. 2G
FIG. 2H

INTERPOSER FOR A PACKAGE-ON-PACKAGE STRUCTURE

I. FIELD

The present disclosure is generally related to package-on-package (PoP) structures.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), tablet computers, and paging devices that are small, lightweight, and easily carried by users. Many such computing devices include other devices that are incorporated therein. For example, a wireless telephone can also include a digital still camera, a digital video camera, a digital recorder, and an audio file player. Also, such computing devices can process executable instructions, including software applications, such as a web browser application that can be used to access the Internet and multimedia applications that utilize a still or video camera and provide multimedia playback functionality.

A wireless device may include memory devices (e.g., memory chips) to store data. Typical memory devices may have between approximately 300 and 400 input/output (I/O) ports. However, wide I/O memory devices may have between approximately 1700 and 2000 I/O ports. Package-on-package (PoP) techniques may be used to package wide I/O memory devices (e.g., to vertically combine/stack a wide I/O memory device with logic circuits or dies) to improve (e.g., increase) component density in wireless computing devices.

A PoP structure may use an interposer as an electrical interface that routes electrical signals between one component of the PoP structure and another component of the PoP structure. For example, an interposer may be used to route electrical signals between an I/O port of a wide I/O memory device of the PoP structure and an associated logic circuit (e.g., die) of the PoP structure. However, a conventional interposer for a PoP structure may occupy a relatively large amount of die area, increasing the package size of the PoP structure. For example, an interposer may use relatively large solder balls to route electrical signals from the I/O ports of the wide I/O memory device to the other components of the PoP structure. The solder balls may increase an interconnect length between the wide I/O memory device and the other components, which may degrade signal integrity and power integrity.

III. SUMMARY

According to one implementation, a package-on-package (PoP) structure includes a first die, a second die, and a memory device electrically coupled to the first die and the second die by an interposer between the first die and the second die. The interposer includes copper-filled vias formed within a mold.

According to another implementation, a method for forming a package-on-package (PoP) structure includes coupling a first die and a second die to a bottom interposer. The method also includes forming a mold on the first die, the second die, and the bottom interposer. The method further includes etching one or more vias within the mold. The one or more vias are located between the first die and the second die. The method also includes filling the one or more vias with copper to form an interposer having one or more copper-filled vias.

According to another implementation, a non-transitory computer-readable medium includes data for forming a package-on-package (PoP) structure. The data, when used by fabrication equipment, causes the fabrication equipment to couple a first die and a second die onto a bottom interposer. The data, when used by the fabrication equipment, further cause the fabrication equipment to form a mold on the first die, the second die, and the bottom interposer. The data, when used by the fabrication equipment, also causes the fabrication equipment to etch one or more vias within the mold. The one or more vias are located between the first die and the second die. The data, when used by the fabrication equipment, further causes the fabrication equipment to fill the one or more vias with copper to form an interposer having one or more copper-filled vias.

According to another implementation, a package-on-package (PoP) structure includes means for performing a first logical function, means for performing a second logical function, and means for storing data. The means for storing data coupled to the means for performing the first logical function and coupled to the means for performing the second logical function. The PoP structure also includes means for routing electrical signals between the means for storing data and at least one of the means for performing the first logical function or the means for performing the second logical function. The means for routing electrical signals is between the means for performing the first logical function and the means for performing the second logical function. The means for routing electrical signals includes copper-filled vias formed within a mold.

IV. BRIEF DESCRIPTION OF THE DRAWINGS

FIG. 2C illustrates another particular stage of forming the PoP structure of FIG. 1;

FIG. 2D illustrates another particular stage of forming the PoP structure of FIG. 1;

FIG. 2E illustrates another particular stage of forming the PoP structure of FIG. 1;

FIG. 2F illustrates another particular stage of forming the PoP structure of FIG. 1;

FIG. 2G illustrates another particular stage of forming the PoP structure of FIG. 1;

FIG. 2H illustrates another particular stage of forming the PoP structure of FIG. 1;

V. DETAILED DESCRIPTION

Techniques and methods for forming a package-on-package (PoP) structure having an interposer formed between two dies of a package are disclosed. For example, vias may be etched into a mold (e.g., a dielectric mold) and filled using copper electroplating to form the interposer. The interposer may be electrically coupled to a bottom interposer of the PoP structure, and the bottom interposer may be electrically coupled to a first die and to a second die. The interposer, the first die, and the second die are included in a common package of the PoP structure. After the interposer is formed and electrically coupled to the bottom interposer, a memory device (e.g., a wide input/output (I/O) memory chip) may be attached to the interposer. Electrical signals (e.g., data) may be routed between the memory device and the dies by way of the interposer.

One particular advantage provided by at least one of the disclosed aspects is the ability to route electrical signals (e.g., data) between a memory chip and dies of a package-on-package (PoP) structure using an interposer formed between the dies. Using the interposer formed between the dies to route electrical signals between the memory chip and the dies may decrease an interconnect length between the memory chip and the dies compared to a conventional PoP structure that uses solder balls (as an interposer) that occupy a relatively large amount of die area. Decreasing the interconnect length may reduce the package size of the PoP structure compared to a conventional PoP structure. Additionally, decreasing the interconnect length may improve signal integrity and power integrity.

Language describing the location of one component with respect the location of another component (e.g., on top of, underneath, top, bottom, etc.) refers to the orientation of the components in the figures. This language should not be construed as limiting. For example, if a structure is rotated, flipped, etc., the location of a component with respect to the location of another component change.

Figure 1:
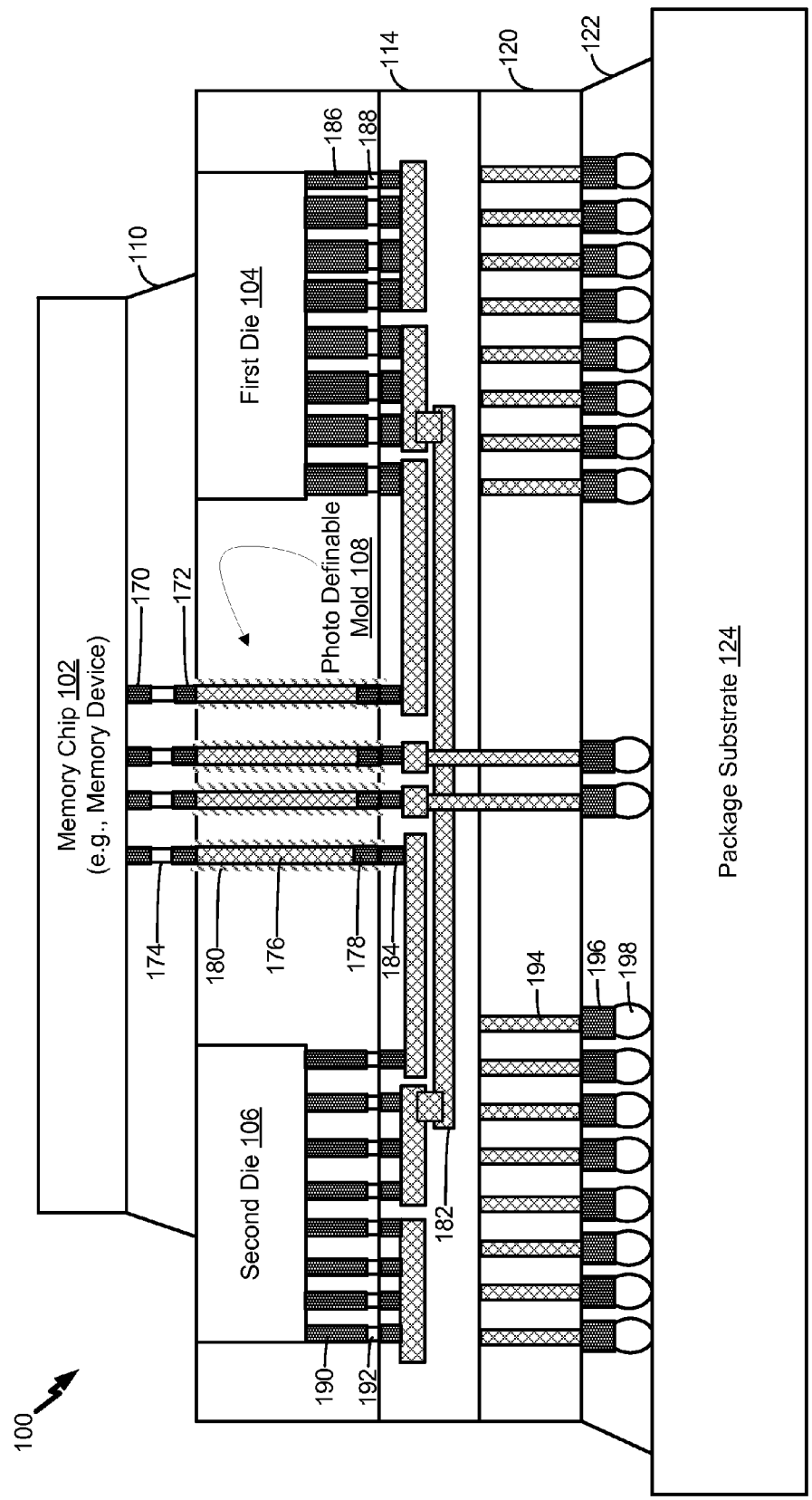
FIG. 1 is a diagram of a particular illustrative aspect of a package-on-package (PoP) structure having an interposer formed between two dies of a package.

Referring to FIG. 1, a particular illustrative aspect of a package-on-package (PoP) structure 100 having an interposer formed between two dies of a package is shown. The PoP structure 100 includes a memory chip 102, a first die 104, a second die 106, and a photo definable mold 108. In a particular aspect, the memory chip 102 is a wide input/output (I/O) memory device. For example, the memory chip 102 may have between approximately 1700 and 2000 I/O ports. The memory chip 102 may be included in a "first package" of the PoP structure 100, and the dies 104, 106 may be included in a "second package" of the PoP structure 100.

The first die 104 may include first circuitry (not shown) that is configured to perform a first logical function. For example, first data from the memory chip 102 may be communicated (e.g., as first electrical signals) from the memory chip 102 to the first circuitry in the first die 104, and the first circuitry may perform the first logical function on the first data. After the first logical function is performed on the first data to produce first modified data, the first modified data may be communicated to the memory chip 102.

In a similar manner, the second die 106 may include second circuitry (not shown) that is configured to perform a second logical function. For example, second data from the memory chip 102 may be communicated (e.g., as second electrical signals) from the memory chip 102 to the second circuitry in the second die 106, and the second circuitry may perform the second logical function on the second data. After the second logical function is performed on the second data to produce second modified data, the second modified data may be communicated to the memory chip 102.

As described in greater detail below, the PoP structure 100 utilizes the photo definable mold 108 and a bottom interposer 114 to communicate (e.g., transmit) electrical signals between the memory chip 102 and at least one of the first die 104 or the second die 106. An interposer may be formed within the photo definable mold 108 between the first die 104 and the second die 106. For example, the photo definable mold 108 may be included in the same "package" as the first die 104 and the second die 106. The bottom interposer 114 may be located underneath the photo definable mold 108 and the dies 104, 106.

An underfill 110 may be used to connect the memory chip 102 to the photo definable mold 108. The underfill 110 may include an epoxy adhesive. For example, the first package (e.g., the memory chip 102) may be mounted on top of the second package (e.g., the first die 104, the second die 106, and the photo definable mold 108) using the epoxy adhesive. Additionally, pads 170 of the memory chip 102 may be electrically coupled to top pads 172 of the photo definable mold 108 by microbumps 174. The microbumps 174 may include copper, tin-silver or tin-silver-copper. Thus, data may be communicated (e.g., as electrical signals) between the memory chip 102 and the photo definable mold 108 by the pads 170, 172 and the microbumps 174. Each pad 170 of the memory chip 102 may be coupled to an I/O port of the memory chip 102. In the implementation of FIG. 1, the memory chip 102 is shown to include four pads 170. In other implementations, the memory chip 102 may include additional pads 170. For example, if the memory chip 102 is a wide I/O memory device, the memory chip 102 may include between approximately 1700 and 2000 pads. Each pad 170 may be coupled to a corresponding I/O port of the wide I/O memory device.

The photo definable mold 108 may include copper-filled vias 176 to form the interposer. Each copper-filled via 176 may be electrically coupled to a corresponding top pad 172 of the photo definable mold 108. In the implementation of FIG. 1, the photo definable mold 108 is shown to include four copper-filled vias 176. In other implementations, the photo definable mold 108 may include additional copper-filled vias. For example, if the memory chip 102 is a wide I/O memory device, the photo definable mold 108 may include between approximately 1700 and 2000 copper-filled vias. The photo definable mold 108 may also include bottom pads or under bump metallurgy (UBM) 178 that are electrically coupled to corresponding copper-filled vias 176. In the implementation of FIG. 1, the photo definable mold 108 is shown to include four bottom pads 178. Each bottom pad 178 may be coupled to a corresponding copper-filled via 176 of the photo definable mold 108. In other implementations, the photo definable mold 108 may include additional bottom pads 178. For example, if the memory chip 102 is a wide I/O memory device, the photo definable mold 108 may include between approximately 1700 and 2000 bottom pads.

The copper-filled vias 176 may be located within the photo definable mold 108. The photo definable mold 108 may be deposited using lamination or thermal compression molding techniques. The photo definable mold 108 may include a material with a high dielectric constant (e.g., a "photo-dielectric" mold) and the photo definable mold 108 may include copper-filled vias 176 A barrier/seed deposition layer 180 may isolate the copper-filled vias from the photo definable mold 108. The barrier/seed deposition layer 180 may be deposited using PVD techniques. For example, the barrier/seed deposition layer 180 may be deposited into vias that are photo defined by lithography into the photo definable mold 108, and the copper (of the copper-filled vias 176) may be deposited into the vias using electroplating techniques to form the copper-filled vias 176. According to one implementation, the photo definable mold 108 may include a dielectric mold.

The photo definable mold 108 may be used to connect the first die 104, the second die 106, and the photo definable mold 108 to the bottom interposer 114. The bottom interposer 114 may include copper-filled vias 182 and top pads 184 that are electrically coupled to the copper-filled vias 176. A subset of top pads 184 of the bottom interposer 114 may be electrically coupled to the bottom pads 178 of the photo definable mold 108 by microbumps (not shown). In the implementation of FIG. 1, the bottom interposer 114 is shown to include four top pads 184 that are electrically coupled to the four bottom pads 178 of the photo definable mold 108.

The bottom interposer 114 may provide an electrical connection between the photo definable mold 108 and the dies 104, 106. For example, a subset of top pads 184 of the bottom interposer 114 may be coupled to bottom pads 186 of the first die 104 by microbumps 188, and a subset of top pads 184 of the bottom interposer 114 may be coupled to bottom pads 190 of the second die 106 by microbumps 192. In the implementation of FIG. 1, eight top pads 184 of the bottom interposer 114 are shown to be coupled to eight bottom pads 186 of the first die 104 by eight corresponding microbumps 188, and eight top pads 184 of the bottom interposer 114 are shown to be coupled to eight bottom pads 190 of the second die 106 by eight corresponding microbumps 192. In the implementation of FIG. 1, the additional (or fewer) pads 184, 186, 190 and microbumps 188, 192 may be present.

The bottom interposer 114 may be mounted on a silicon substrate 120, the silicon substrate 120 may be mounted on an underfill 122, and the underfill 122 may be mounted on a package substrate 124. Copper-filled vias 194 may be formed in the silicon substrate 120, pads 196 may be electrically coupled to the copper-filled vias 194 of the silicon substrate 120, and microbumps 198 may electrically couple the pads 196 to the package substrate 124.

The PoP structure 100 of FIG. 1 may enable electrical signals (e.g., representing data) to be routed between the memory chip 102 and the dies 104, 106 by way of the photo definable mold 108 formed between the dies 104, 106. For example, electrical signals may be transmitted from the memory chip 102 to the photo definable mold 108 using conductivity paths (e.g., the bottom pads 170 of the memory chip 102, the microbumps 174, and the top pads 172 of the photo definable mold 108) between the memory chip 102 and the photo definable mold 108. The electrical signals may be routed through the copper-filled vias 176 of the photo definable mold 108 and to the bottom interposer 114 by way of conductivity paths (e.g., the bottom pads 178 of the photo definable mold 108, the microbumps (not shown), and the top pads 184 of the bottom interposer 114) between the photo definable mold 108 and the bottom interposer 114. The electrical signals may be routed through the copper-filled vias 182 of the bottom interposer 114 and to either the first die 104 or the second die 116 by way of conductivity paths between the bottom interposer 114 and the dies 104, 106.

Using the photo definable mold 108 formed between the first and second dies 104, 106 to route electrical signals between the memory chip 102 and the dies 104, 106 may decrease an interconnect length between the memory chip 102 and the dies 104, 106 compared to a conventional PoP structure that uses solder balls (as an interposer) that occupy a relatively large amount of die area. Decreasing the interconnect length may reduce the package size of the PoP structure 100 compared to a conventional PoP structure. Additionally, decreasing the interconnect length may improve signal integrity and power integrity.

Figure 2A:
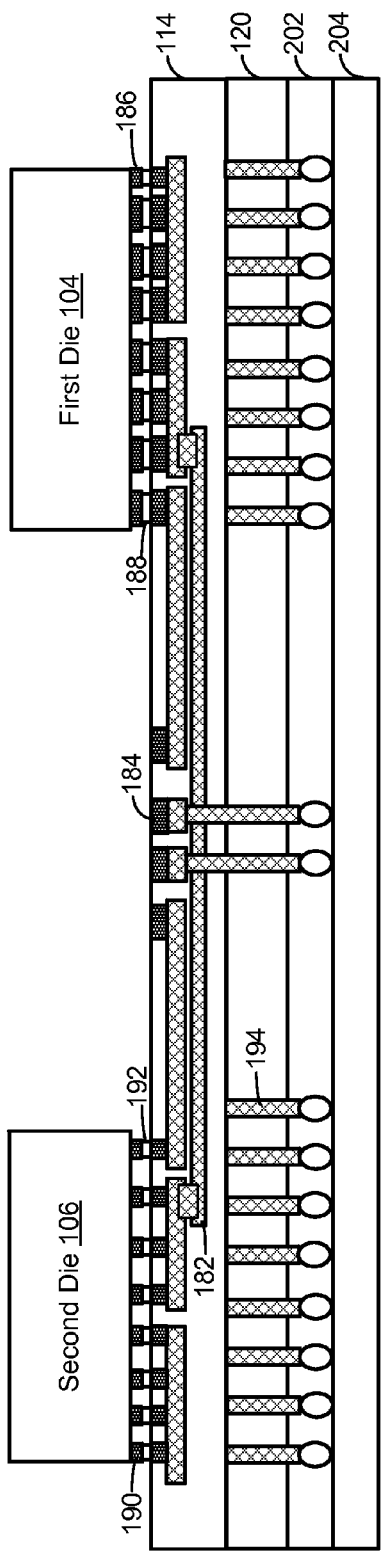
FIG. 2A illustrates a particular stage of forming the PoP structure of FIG. 1.

Referring to FIG. 2A, a particular stage of forming the PoP structure 100 of FIG. 1 is shown. At the stage of FIG. 2A, the first die 104 and the second die 106 are coupled to the bottom interposer 114. For example, the first die 104 may be attached to the bottom interposer 114, and the second die 106 may be attached to the bottom interposer 114. The dies 104, 106 may be attached to the bottom interposer 114 using a reflow process (e.g., a thermal process).

Additionally, at the stage of FIG. 2A, a backside of the wafer (e.g., the silicon substrate 120) may be placed on (e.g., attached to) a temporary carrier 204 using temporary carrier bonding techniques. For example, the temporary carrier 204 may be attached to the wafer using a temporary glue 202 (or adhesive). The techniques of FIG. 2A may be performed using the fabrication equipment described with respect to FIG. 5.

Figure 2B:
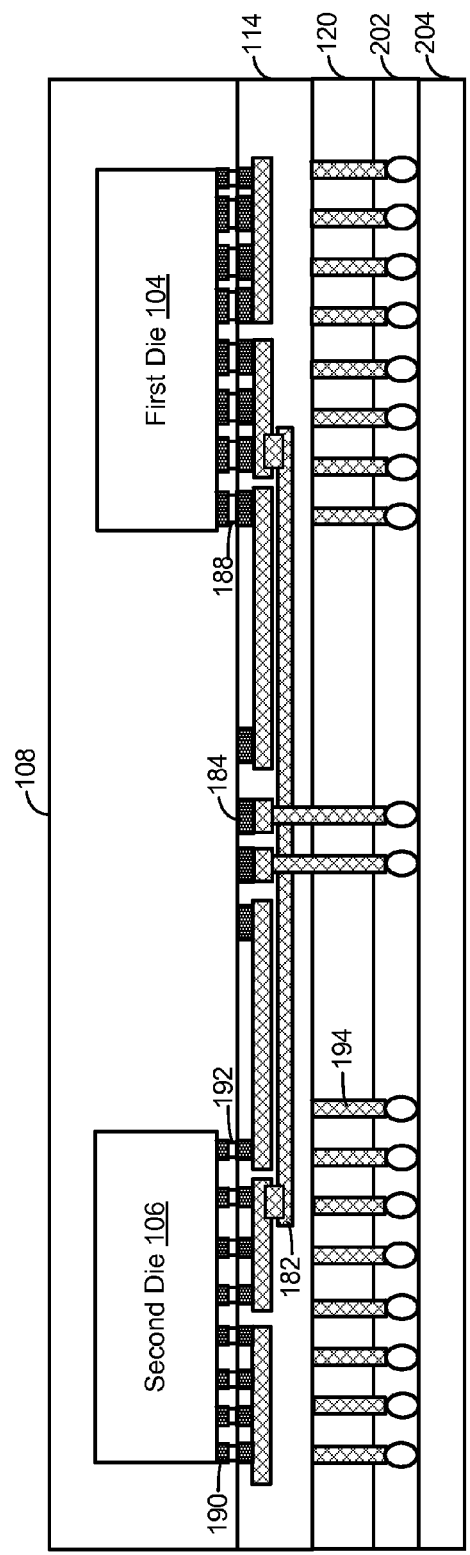
FIG. 2B illustrates another particular stage of forming the PoP structure of FIG. 1.

Referring to FIG. 2B, another particular stage of forming the PoP structure 100 of FIG. 1 is shown. At the stage of FIG. 2B, the photo definable mold 108 (e.g., a photo "pattern-able" mold or polymer) is deposited on top of the first die 104, on top of the second die 106, and on top of the bottom interposer 114. The photo definable mold 108 may be deposited using lamination deposition techniques, thermal compression molding techniques, or molding deposition techniques. In one implementation, the photo definable mold 108 may include a "photo-dielectric" mold. The techniques of FIG. 2B may be performed using the fabrication equipment described with respect to FIG. 5.

Referring to FIG. 2C, another particular stage of forming the PoP structure 100 of FIG. 1 is shown. At the stage of FIG. 2C, a plurality of vias may be etched through the photo definable mold 108. For example, a photo resist (not shown) may be deposited (e.g., patterned) on top of the photo definable mold 108 using a lithography (e.g., a photolithography) process. After depositing the photo resist, portions of the photo resist may be "opened" to pattern areas for a dry etch process, and the vias may be etched through the photo definable mold 108 during the dry etch process. After the vias are etched through the photo definable mold 108, the phot resist may be removed. The vias may be etched using the fabrication equipment described with respect to FIG. 5.

Referring to FIG. 2D, another particular stage of forming the PoP structure 100 of FIG. 1 is shown. At the stage of FIG. 2D, seed layers and barrier layers (e.g., the barrier/seed deposition layer 180) are deposited into the vias using a physical vapor deposition (PVD) process. The seed layers may include copper, and the barrier layers may include tantalum or silicon nitride. The techniques of FIG. 2D may be performed using the fabrication equipment described with respect to FIG. 5.

Referring to FIG. 2E, another particular stage of forming the PoP structure 100 of FIG. 1 is shown. At the stage of FIG. 2E, a photo resist layer 206 may be deposited (e.g., patterned) on top of the barrier/seed deposition layer 180 using a lithography (e.g., photolithography) process. The techniques of FIG. 2E may be performed using the fabrication equipment described with respect to FIG. 5.

Referring to FIG. 2F, another particular stage of forming the PoP structure 100 of FIG. 1 is shown. At the stage of FIG. 2F, the vias are filled with copper using a copper electroplating process. The techniques of FIG. 2F may be performed using the fabrication equipment described with respect to FIG. 5.

Referring to FIG. 2G, another particular stage of forming the PoP structure 100 of FIG. 1 is shown. At the stage of FIG. 2G, the photo resist layer 206 and the portions of the barrier/seed deposition layer 180 underneath the photo resist layer 206 may be removed using a planarization process (e.g., a chemical mechanical planarization (CMP) process). For example, the front side of the wafer undergoes planarization to expose portions of the photo definable mold 108 that were previously covered by the photo resist layer 206. The techniques of FIG. 2G may be performed using the fabrication equipment described with respect to FIG. 5.

Referring to FIG. 2H, another particular stage of forming the PoP structure 100 of FIG. 1 is shown. At the stage of FIG. 2H, the memory chip 102 is placed on top of the photo definable mold 108 and the dies 104, 106 using thermal compression bonding. For example, the pads of the memory chip 102 may be attached to top pads of the photo definable mold 108 using a thermal heating process (e.g., reflow). After the thermal heating process, the underfill 110 may be dispensed between the photo definable mold 108 and the memory chip 102. In a particular implementation, the underfill 110 may be dispensed prior to attaching the memory chip 102. The techniques of FIG. 2H may be performed using the fabrication equipment described with respect to FIG. 5.

After the memory chip 102 is attached, the temporary carrier 204 may be detached from the wafer using a temporary carrier debonding process. The temporary carrier debonding process may be performed using the fabrication equipment described with respect to FIG. 5. After the debonding process, the wafer may be deposited onto the package substrate 124, as shown in FIG. 1.

The stages described with respect to FIGS. 2A-2H may enable fabrication of a structure where electrical signals (e.g., data) are routed between the memory chip 102 and the dies 104, 106 by way of the photo definable mold 108 formed between the dies 104, 106. For example, electrical signals may be transmitted from the memory chip 102 to the photo definable mold 108 using conductivity paths (e.g., the bottom pads of the memory chip 102, the microbumps, and the top pads of the photo definable mold 108) between the memory chip 102 and the photo definable mold 108. The electrical signals may be routed through the copper-filled vias of the photo definable mold 108 and to the bottom interposer 114 by way of conductivity paths (e.g., the bottom pads of the photo definable mold 108, the microbumps, and the top pads of the bottom interposer 114) between the photo definable mold 108 and the bottom interposer 114. The electrical signals may be routed through the copper-filled vias of the bottom interposer 114 and to either the first die 104 or the second die 116 by way of conductivity paths between the bottom interposer 114 and the dies 104, 106.

Using the photo definable mold 108 formed between the first and second dies 104, 106 to route electrical signals between the memory chip 102 and the dies 104, 106 may decrease an interconnect length between the memory chip 102 and the dies 104, 106 compared to a conventional PoP structure that uses solder balls (as an interposer) that occupy a relatively large amount of die area. Decreasing the interconnect length may reduce the package size of the PoP structure 100 compared to a conventional PoP structure. Additionally, decreasing the interconnect length may improve signal integrity and power integrity.

Figure 3:
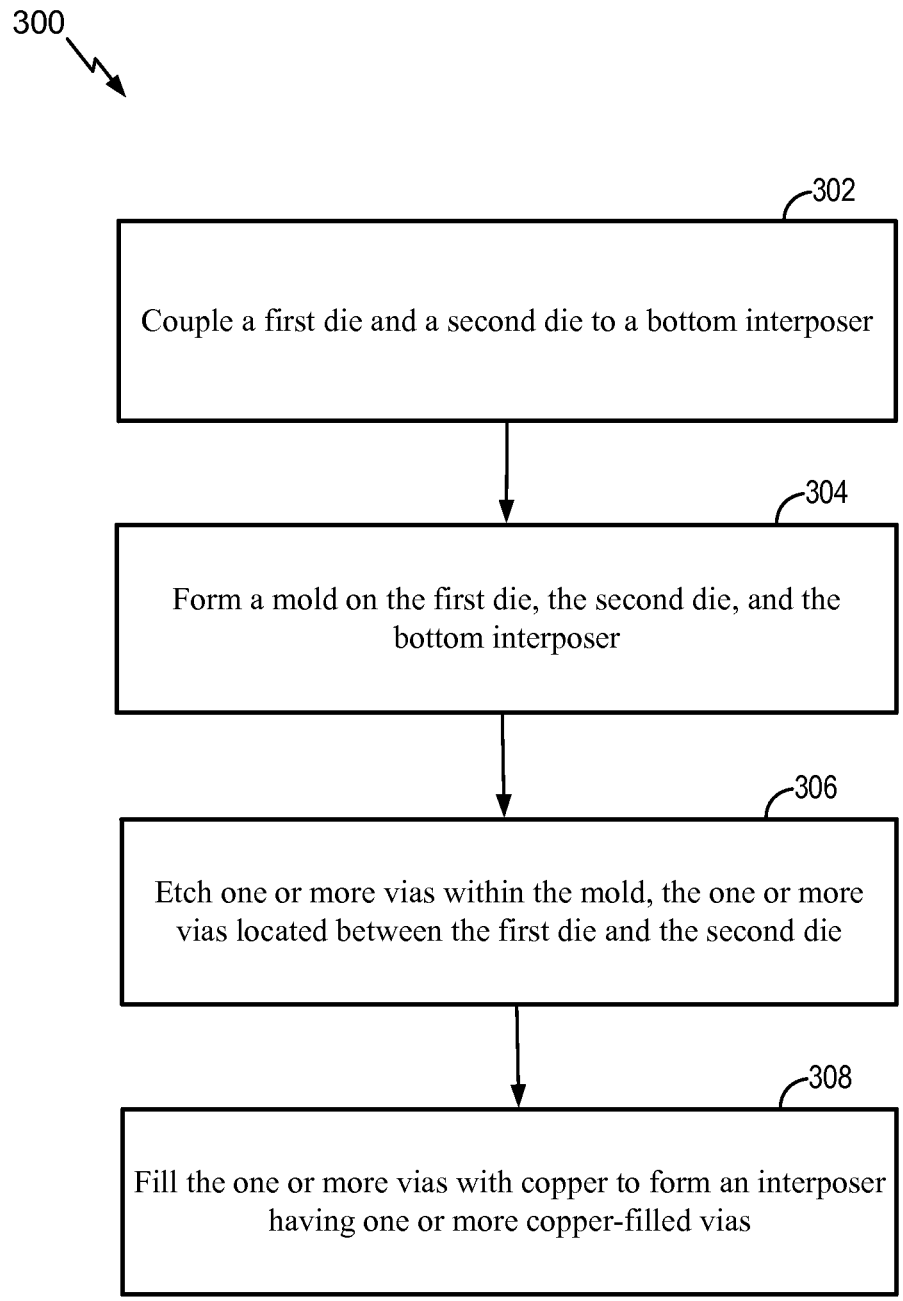
FIG. 3 is a flowchart of a particular illustrative aspect of a method for forming a PoP structure having an interposer for formed between two dies of a package.

Referring to FIG. 3, a flowchart of a method 300 for forming a PoP structure having an interposer between two dies of a package is shown. The method 300 may be performed using the fabrication equipment described with respect to FIG. 5.

The method 300 includes coupling a first die and a second die to a bottom interposer, at 302. For example, referring to FIG. 2A, the first die 104 and the second die 106 may be coupled to the bottom interposer 114. The dies 104, 106 may be attached to (e.g., electrically coupled to) the bottom interposer 114 using a reflow process (e.g., a thermal process).

A mold may be formed on the first die, the second die, and the bottom interposer, at 304. For example, referring to FIG. 2B, the photo definable mold 108 (e.g., a photo "patternable" mold) may be deposited on the first die 104, on the second die 106, and on the bottom interposer 114. The photo definable mold 108 may be deposited using lamination deposition techniques, thermal compression molding techniques, or molding deposition techniques. In one implementation, the photo definable mold 108 may include a photo-dielectric mold.

One or more vias may be etched within the mold, at 306. The one or more vias may be located between the first die and the second die. For example, referring to FIG. 2C, a plurality of vias may be etched through the photo definable mold 108. For example, a photo resist may be deposited (e.g., patterned) on top of the photo definable mold 108 using a lithography (e.g., a photolithography) process. After depositing the photo resist, portions of the photo resist may be "opened" to pattern areas for a dry etch process, and the vias may be etched through the photo definable mold 108 during the dry etch process.

According to one implementation, the method 300 may include depositing a barrier/seed deposition layer into the one or more vias. For example, referring to FIG. 2D, seed layers and barrier layers (e.g., the barrier/seed deposition layer 180) may be deposited into the vias using a physical vapor deposition (PVD) process. The seed layers may be comprised of copper, and the barrier layers may be comprised of tantalum or silicon nitride.

The one or more via may be filled with copper to form an interposer having one or more copper-filled vias, at 308. For example, referring to FIG. 2F, the vias may be filled with copper using a copper electroplating process. The one or more copper-filled vias 176 may be electrically coupled to the bottom interposer 114, and the bottom interposer 114 may be electrically coupled to the first die 104 and to the second die 106.

According to one implementation, the method 300 may include electrically coupling a memory device to the first die, to the second die, and to the interposer. The interposer may be configured to route signal between the memory device and at least one of the first die or the second die. For example, referring to FIG. 2H, the memory chip 102 may be coupled to the photo definable mold 108 and the dies 104, 106 using thermal compression bonding. For example, the pads of the memory chip 102 may be attached to top pads of the photo definable mold 108 using a thermal heating process. After the thermal heating process, the underfill 110 may be dispensed between the photo definable mold 108 and the memory chip 102. In a particular implementation, the underfill 110 may be dispensed prior to attaching the memory chip 102.

The method 300 of FIG. 3 may enable electrical signals (e.g., data) to be routed between the memory chip 102 and the dies 104, 106 via the photo definable mold 108 formed between the dies 104, 106. For example, electrical signals may be transmitted from the memory chip 102 to the photo definable mold 108 using conductivity paths (e.g., the bottom pads of the memory chip 102, the microbumps, and the top pads of the photo definable mold 108) between the memory chip 102 and the photo definable mold 108. The electrical signals may be routed through the copper-filled vias of the photo definable mold 108 and to the bottom interposer 114 via conductivity paths (e.g., the bottom pads of the photo definable mold 108, the microbumps, and the top pads of the bottom interposer 114) between the photo definable mold 108 and the bottom interposer 114. The electrical signals may be routed through the copper-filled vias of the bottom interposer 114 and to either the first die 104 or the second die 116 via conductivity paths between the bottom interposer 114 and the dies 104, 106.

Using the photo definable mold 108 formed between the first and second dies 104, 106 to route electrical signals between the memory chip 102 and the dies 104, 106 may decrease an interconnect length between the memory chip 102 and the dies 104, 106 compared to a conventional PoP structure that uses solder balls (as an interposer) that occupy a relatively large amount of die area. Decreasing the interconnect length may reduce the package size of the PoP structure 100 compared to a conventional PoP structure. Additionally, decreasing the interconnect length may improve signal integrity and power integrity.

Figure 4:
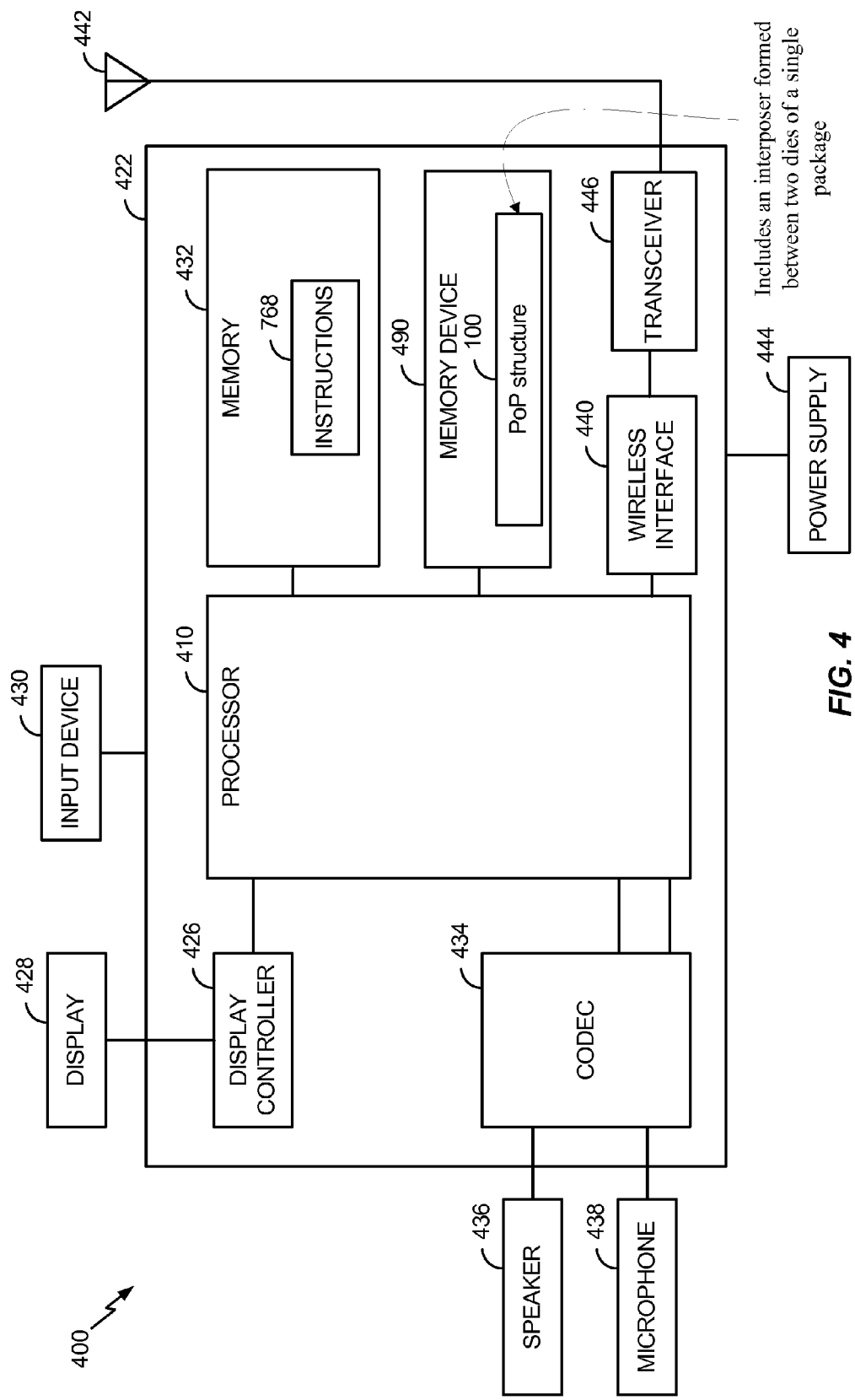
FIG. 4 is a block diagram of a device that includes a PoP structure having an interposer for formed between two dies of a package.

Referring to FIG. 4, a particular illustrative aspect of a wireless communication device is depicted and generally designated 400. The device 400 includes a processor 410, such as a digital signal processor, coupled to a memory 432.

The processor 410 may be configured to execute software (e.g., a program of one or more instructions 468) stored in the memory 432. A memory device 490 may be coupled to the processor 410. The memory device 490 may include the PoP structure 100 of FIG. 1. For example, the PoP structure 100 may include an interposer formed between two dies of a single package.

A wireless interface 440 may be coupled to the processor 410 and to an antenna 442. A coder/decoder (CODEC) 434 can also be coupled to the processor 410. A speaker 436 and a microphone 438 can be coupled to the CODEC 434. A display controller 426 can be coupled to the processor 410 and to a display device 428. In a particular aspect, the processor 410, the display controller 426, the memory 432, the CODEC 434, and the wireless interface 440 are included in a system-in-package or system-on-chip device 422. In a particular aspect, an input device 430 and a power supply 444 are coupled to the system-on-chip device 422. Moreover, in a particular aspect, as illustrated in FIG. 4, the display device 428, the input device 430, the speaker 436, the microphone 438, the antenna 442, and the power supply 444 are external to the system-on-chip device 422. However, each of the display device 428, the input device 430, the speaker 436, the microphone 438, the antenna 442, and the power supply 444 can be coupled to one or more components of the system-on-chip device 422, such as one or more interfaces or controllers.

In conjunction with the described aspects, a package-on-package (PoP) structure includes means for performing a first logical function. For example, the means for performing the first logical function include the first die 104 of FIG. 1, one or more other devices, or one or more other modules.

The PoP structure may also include means for performing a second logical function. For example, the means for performing the second logical function may include the second die 106 of FIG. 1, one or more other devices, or one or more other modules.

The PoP structure may also include means for storing data. The means for storing data may be coupled to the means for performing the first logical function and coupled to the means for performing the second logical function. For example, the means for storing data may include the memory chip 102 (e.g., the memory device) of FIG. 1, one or more other devices, or one or more other modules.

The PoP structure may also include means for routing electrical signals between the means for storing data and at least one of the means for performing the first logical function or the means for performing the second logical function. The means for routing electrical signals may be between the means for performing the first logical function and the means for performing the second logical function. The means for routing electrical signals may include copper-filled vias formed within a mold. For example, the means for routing electrical signals may include the photo definable mold 108 of FIG. 1.

Figure 5:
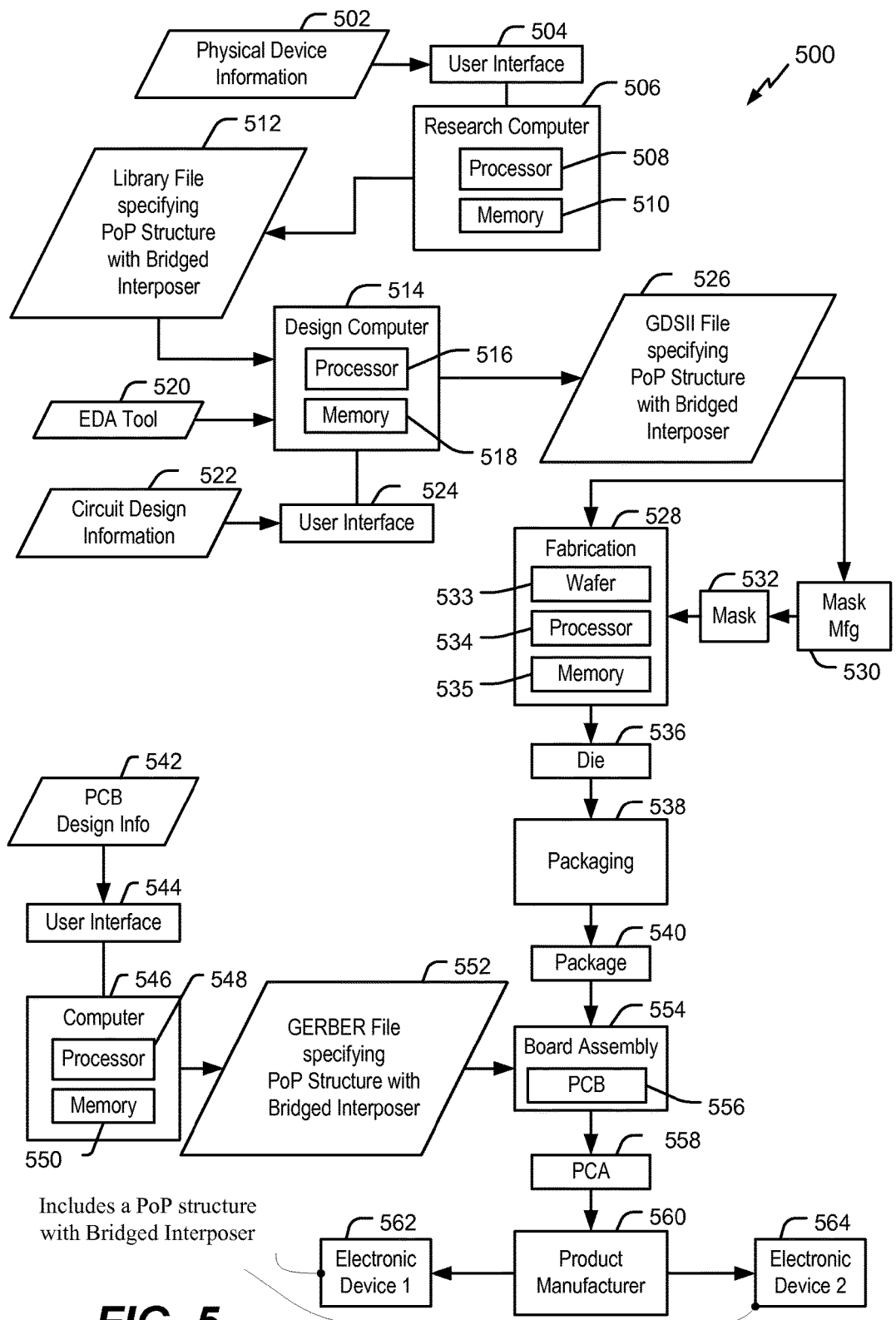
FIG. 5 is a data flow diagram of a particular illustrative aspect of a manufacturing process to manufacture electronic devices that include a PoP structure having an interposer for formed between two dies of a package.

The foregoing disclosed devices and functionalities may be designed and configured into computer files (e.g., RTL, GDSII, GERBER, etc.) stored on computer-readable media. Some or all such files may be provided to fabrication handlers to fabricate devices based on such files. Resulting products include wafers that are then cut into dies and packaged into chips. The chips are then employed in devices described above. FIG. 5 depicts a particular illustrative aspect of an electronic device manufacturing process 500.

Physical device information 502 is received at the manufacturing process 500, such as at a research computer 506. The physical device information 502 may include design information representing at least one physical property of a semiconductor device, such as a physical property of the PoP structure 100 of FIG. 1. For example, the physical device information 502 may include physical parameters, material characteristics, and structure information that is entered via a user interface 504 coupled to the research computer 506. The research computer 506 includes a processor 508, such as one or more processing cores, coupled to a computer-readable medium such as a memory 510. The memory 510 may store computer-readable instructions that are executable to cause the processor 508 to transform the physical device information 502 to comply with a file format and to generate a library file 512.

In a particular aspect, the library file 512 includes at least one data file including the transformed design information. For example, the library file 512 may include a library of semiconductor devices, including the PoP structure 100 of FIG. 1, provided for use with an electronic design automation (EDA) tool 520.

The library file 512 may be used in conjunction with the EDA tool 520 at a design computer 514 including a processor 516, such as one or more processing cores, coupled to a memory 518. The EDA tool 520 may be stored as processor executable instructions at the memory 518 to enable a user of the design computer 514 to design a circuit including the PoP structure 100 of FIG. 1, using the library file 512. For example, a user of the design computer 514 may enter circuit design information 522 via a user interface 524 coupled to the design computer 514. The circuit design information 522 may include design information representing at least one physical property of a semiconductor device, such as the PoP structure 100 of FIG. 1. To illustrate, the circuit design property may include identification of particular circuits and relationships to other elements in a circuit design, positioning information, feature size information, interconnection information, or other information representing a physical property of an electronic device.

The design computer 514 may be configured to transform the design information, including the circuit design information 522, to comply with a file format. To illustrate, the file formation may include a database binary file format representing planar geometric shapes, text labels, and other information about a circuit layout in a hierarchical format, such as a Graphic Data System (GDSII) file format. The design computer 514 may be configured to generate a data file including the transformed design information, such as a GDSII file 526 that includes information describing the PoP structure 100 of FIG. 1, in addition to other circuits or information. To illustrate, the data file may include information corresponding to a system-on-chip (SOC) or a chip interposer component that that includes the PoP structure 100 of FIG. 1, and that also includes additional electronic circuits and components within the SOC.

The GDSII file 526 may be received at a fabrication process 528 to manufacture the PoP structure 100 of FIG. 1 according to transformed information in the GDSII file 526. For example, a device manufacture process may include providing the GDSII file 526 to a mask manufacturer 530 to create one or more masks, such as masks to be used with photolithography processing, illustrated in FIG. 5 as a representative mask 532. The mask 532 may be used during the fabrication process to generate one or more wafers 533, which may be tested and separated into dies, such as a representative die 536. The die 536 includes a circuit including the PoP structure 100 of FIG. 1.

In a particular aspect, the fabrication process 528 may be initiated by or controlled by a processor 534. The processor 534 may access a memory 535 that includes executable instructions such as computer-readable instructions or processor-readable instructions. The executable instructions may include one or more instructions that are executable by a computer, such as the processor 534.

The fabrication process 528 may be implemented by a fabrication system that is fully automated or partially automated. For example, the fabrication process 528 may be automated and may perform processing steps according to a schedule. The fabrication system may include fabrication equipment (e.g., processing tools) to perform one or more operations to form an electronic device. For example, the fabrication equipment may be configured to perform one or more of the processes described with reference to FIGS. 2A-2H using integrated circuit manufacturing processes (e.g., wet etching, chemical vapor etching, dry etching, deposition, chemical vapor deposition, planarization, lithography, in-situ baking, or a combination thereof).

The fabrication system may have a distributed architecture (e.g., a hierarchy). For example, the fabrication system may include one or more processors, such as the processor 534, one or more memories, such as the memory 535, and/or controllers that are distributed according to the distributed architecture. The distributed architecture may include a high-level processor that controls or initiates operations of one or more low-level systems. For example, a high-level portion of the fabrication process 528 may include one or more processors, such as the processor 534, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular aspect, the fabrication system may include multiple processors that are distributed in the fabrication system. For example, a controller of a low-level system component of the fabrication system may include a processor, such as the processor 534.

Alternatively, the processor 534 may be a part of a high-level system, subsystem, or component of the fabrication system. In another aspect, the processor 534 includes distributed processing at various levels and components of a fabrication system.

The die 536 may be provided to a packaging process 538 where the die 536 is incorporated into a representative package 540. For example, the package 540 may include the single die 536 or multiple dies, such as a PoP arrangement. The package 540 may be configured to conform to one or more standards or specifications, such as Joint Electron Device Engineering Council (JEDEC) standards.

Information regarding the package 540 may be distributed to various product designers, such as via a component library stored at a computer 546. The computer 546 may include a processor 548, such as one or more processing cores, coupled to a memory 550. A printed circuit board (PCB) tool may be stored as processor executable instructions at the memory 550 to process PCB design information 542 received from a user of the computer 546 via a user interface 544. The PCB design information 542 may include physical positioning information of a packaged electronic device on a circuit board, the packaged electronic device corresponding to the package 540 including the PoP structure 100 of FIG. 1.

The computer 546 may be configured to transform the PCB design information 542 to generate a data file, such as a GERBER file 552 with data that includes physical positioning information of a packaged electronic device on a circuit board, as well as layout of electrical connections such as traces and vias, where the packaged electronic device corresponds to the package 540 including the PoP structure 100 of FIG. 1. In other aspects, the data file generated by the transformed PCB design information may have a format other than a GERBER format.

The GERBER file 552 may be received at a board assembly process 554 and used to create PCBs, such as a representative PCB 556, manufactured in accordance with the design information stored within the GERBER file 552. For example, the GERBER file 552 may be uploaded to one or more machines to perform various steps of a PCB production process. The PCB 556 may be populated with electronic components including the package 540 to form a representative printed circuit assembly (PCA) 558.

The PCA 558 may be received at a product manufacturer 560 and integrated into one or more electronic devices, such as a first representative electronic device 562 and a second representative electronic device 564. As an illustrative, non-limiting example, the first representative electronic device 562, the second representative electronic device 564, or both, may be selected from a set top box, a music player, a video player, an entertainment unit, a navigation device, a communications device, a personal digital assistant (PDA), a fixed location data unit, and a computer, into which the PoP structure 100 of FIG. 1, is integrated. As another illustrative, non-limiting example, referring to FIG. 5, one or more of the electronic devices 562 and 564 may be a wireless communication device. As another illustrative, non-limiting example, one or more of the electronic devices 562 and 564 may also be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 5 illustrates remote units according to teachings of the disclosure, the disclosure is not limited to these illustrated units. Aspects of the disclosure may be suitably employed in any device which includes active integrated circuitry including memory and on-chip circuitry.

A device that includes the PoP structure 100 of FIG. 1, may be fabricated, processed, and incorporated into an electronic device, as described in the illustrative manufacturing process 500. One or more aspects of the aspects disclosed with respect to FIGS. 1-4 may be included at various processing stages, such as within the library file 512, the GDSII file 526, and the GERBER file 552, as well as stored at the memory 510 of the research computer 506, the memory 518 of the design computer 514, the memory 550 of the computer 546, the memory of one or more other computers or processors (not shown) used at the various stages, such as at the board assembly process 554, and also incorporated into one or more other physical aspects such as the mask 532, the die 536, the package 540, the PCA 558, other products such as prototype circuits or devices (not shown), or any combination thereof. Although various representative stages are depicted with reference to FIGS. 1-6, in other aspects fewer stages may be used or additional stages may be included. Similarly, the process 500 of FIG. 5 may be performed by a single entity or by one or more entities performing various stages of the manufacturing process 500.

Those of skill would further appreciate that the various illustrative logical blocks, configurations, modules, circuits, and algorithm steps described in connection with the aspects disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary non-transitory (e.g. tangible) storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal In the alternative, the processor and the storage medium may reside as discrete components in a computing device or user terminal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. A package-on-package (PoP) structure comprising:
    a first die;
    a second die;
    a mold between the first die and the second die, the mold including copper-filled vias including a barrier/seed deposition layer and copper, the barrier/seed deposition layer configured to isolate the copper from the mold; and
    a memory device configured to electrically couple to the first die and to the second die by the copper-filled vias.

2. The POP structure of claim 1, wherein the mold comprises a photo-dielectric mold.

3. The POP structure of claim 1, wherein the copper-filled vias are configured to:
    route first electrical signals between the memory device and the first die; and
    route second electrical signals between the memory device and the second die.

4. The PoP structure of claim 3, further comprising a bottom interposer configured to electrically couple to the copper-filled vias, wherein the first electrical signals are routed between the memory device and the first die by way of the bottom interposer, and wherein the second electrical signals are routed between the memory device and the second die by way of the bottom interposer.

5. The PoP structure of claim 1, wherein the memory device includes a wide input/output (I/O) memory device.

6. The PoP structure of claim 5, wherein the wide I/O memory device includes between approximately 1700 I/O ports and 2000 I/O ports.

7. The PoP structure of claim 1, wherein the memory device is included in a first package of the PoP structure.

8. The PoP structure of claim 1, wherein the first die, the second die, and the copper-filled vias are included in a second package of the PoP structure.

9. The PoP structure of claim 1, wherein the first die, the second die, the memory device, and the copper-filled vias are integrated into a wireless device, a communications device, a personal digital assistant (PDA), a navigation device, a music player, a video player, an entertainment unit, a fixed location data unit, and a computer.

10. A method for forming a package-on-package (PoP) structure, the method comprising:
    coupling a first die and a second die to a bottom interposer;
    forming a mold on the first die, the second die, and the bottom interposer;
    etching one or more vias within the mold, the one or more vias located between the first die and the second die;

depositing a barrier/seed deposition layer into the one or more vias prior to filling the one or more vias with copper; and filling the one or more vias with copper to form an interposer having one or more copper-filled vias.

11. The method of claim 10, wherein the mold comprises a photo-dielectric mold.

12. The method of claim 10, wherein the one or more copper-filled vias are electrically coupled to the bottom interposer, and wherein the bottom interposer is electrically coupled to the first die and to the second die.

13. The method of claim 10, further comprising coupling a memory device to the first die, the second die, and the interposer, the interposer configured to route electrical signals between the memory device and at least one of the first die or the second die.

14. The method of claim 13, wherein the PoP structure comprises the interposer, the first die, the second die, the bottom interposer, and the memory device.

15. The method of claim 13, wherein the memory device includes a wide input/output (I/O) memory device.

16. The method of claim 15, wherein the wide I/O memory device includes between approximately 1700 I/O ports and 2000 I/O ports.

17. The method of claim 13, wherein the memory device is included in a first package of the PoP structure, and wherein the first die, the second die, and the interposer are included in a second package of the PoP structure.

18. The method of claim 10, wherein coupling the first die and the second die onto the bottom interposer is performed using fabrication equipment, wherein forming the mold is performed using the fabrication equipment, wherein etching the one or more vias is performed using the fabrication equipment, and wherein filling the one or more vias with the copper is performed using the fabrication equipment.

19. A non-transitory computer-readable medium comprising data for forming a package-on-package (PoP) structure, the data, when used by fabrication equipment, causes the fabrication equipment to:
couple a first die and a second die onto a bottom interposer;
form a mold on the first die, the second die, and the bottom interposer;
etch one or more vias within the mold, the one or more vias located between the first die and the second die;
deposit a barrier/seed deposition layer into the one or more vias prior to filling the one or more vias with copper; and
fill the one or more vias with copper to form an interposer having one or more copper-filled vias.

20. The non-transitory computer-readable medium of claim 19, wherein the mold comprises a photo-dielectric mold.

21. The non-transitory computer-readable medium of claim 19, wherein the one or more copper-filled vias are electrically coupled to the bottom interposer, and wherein the bottom interposer is electrically coupled to the first die and to the second die.

22. The non-transitory computer-readable medium of claim 19, wherein the data further causes the fabrication equipment to couple a memory device to the first die, the second die, and the interposer, the interposer configured to route electrical signals between the memory device an at least one of the first die or the second die.

23. The non-transitory computer-readable medium of claim 22, wherein the PoP structure comprises the interposer, the first die, the second die, the bottom interposer, and the memory device.

24. The non-transitory computer-readable medium of claim 22, wherein the memory device includes a wide input/output (I/O) memory device.

25. The non-transitory computer-readable medium of claim 24, wherein the wide I/O memory device includes between approximately 1700 I/O ports and 2000 I/O ports.

26. The non-transitory computer-readable medium of claim 22, wherein the memory device is included in a first package of the PoP structure, and wherein the first die, the second die, and the interposer are included in a second package of the PoP structure.

27. A package-on-package (PoP) structure comprising:
means for performing a first logical function;
means for performing a second logical function;
means for storing data, the means for storing data configured to electrically couple to the means for performing the first logical function and configured to electrically couple to the means for performing the second logical function; and
means for routing electrical signals between the means for storing data and at least one of the means for performing the first logical function or the means for performing the second logical function, the means for routing electrical signals is between the means for performing the first logical function and the means for performing the second logical function, and the means for routing electrical signals comprising:
copper-filled vias within a mold, wherein the copper-filled vias include a barrier/seed deposition layer and copper, the barrier/seed deposition layer configured to isolate the copper from the mold.

28. The POP structure of claim 27, wherein the mold comprises a photo-dielectric mold.

* * * * *